(12) United States Patent
Farnworth et al.

(10) Patent No.: US 6,319,354 B1
(45) Date of Patent: *Nov. 20, 2001

(54) SYSTEM AND METHOD FOR DICING SEMICONDUCTOR COMPONENTS

(75) Inventors: Warren M. Farnworth, Nampa; Alan G. Wood, Boise, both of ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 09/693,443

(22) Filed: Oct. 20, 2000

Related U.S. Application Data

(63) Continuation of application No. 09/110,226, filed on Jul. 6, 1998, now Pat. No. 6,136,137.

(51) Int. Cl.[7] .................................................. B32B 35/00
(52) U.S. Cl. .......................... 156/344; 156/584; 438/464; 438/976
(58) Field of Search ................................. 156/344, 584; 438/464, 976, FOR 386

(56) References Cited

U.S. PATENT DOCUMENTS

| | | |
|---|---|---|
| D. 387,364 | 12/1997 | Boucher et al. . |
| 4,711,014 | 12/1987 | Althouse . |
| 4,778,326 | 10/1988 | Althouse et al. . |
| 5,609,148 | 3/1997 | Mitwalsky et al. . |
| 5,674,785 | 10/1997 | Akram et al. . |
| 5,682,061 | 10/1997 | Khandros et al. . |
| 5,682,731 | 11/1997 | Althouse . |
| 5,685,885 | 11/1997 | Khandros et al. . |
| 5,718,615 | 2/1998 | Boucher et al. . |
| 5,739,585 | 4/1998 | Akram et al. . |
| 5,834,162 | 11/1998 | Malba . |
| 5,891,295 | 4/1999 | Barringer et al. . |
| 6,136,137 | * 10/2000 | Farnworth et al. .................. 156/344 |

FOREIGN PATENT DOCUMENTS 57-210641    12/1982    (JP) .

OTHER PUBLICATIONS

"Standard Tray Carrier For Chip–Scale BGA Devices", Application Note 7, Tessera, Inc., Aug. 18, 1996, pp. 1–4.

* cited by examiner

Primary Examiner—Mark A. Osele
(74) Attorney, Agent, or Firm—Stephen A. Gratton

(57) ABSTRACT

A method and system for dicing semiconductor components, such as bare dice and chip scale packages, are provided. Initially, the semiconductor components are contained on a wafer or a panel. Next, an insert that includes a base and an adhesive layer, is used to support the substrate for separation into separate components by sawing or other process. The insert with the separated components retained thereon, is then transferred to a carrier tray constructed according to JEDEC standards. The carrier tray is adapted for stacking and for handling by conveyors, magazines and other standard equipment. The system includes the substrate, the insert, and the standardized carrier tray.

26 Claims, 5 Drawing Sheets

PROVIDING A SUBSTRATE 12 HAVING MULTIPLE
SEMICONDUCTOR COMPONENTS 14

PROVIDING AN INSERT 16 (OR 16A) CONFIGURED TO
RETAIN THE SUBSTRATE 12 FOR SEPARATION
INTO SEPARATE COMPONENTS 14

PROVIDING A CARRIER TRAY 18 CONFIGURED TO
RETAIN ONE OR MORE INSERTS 16 (OR 16A)

PLACING THE SUBSTRATE 12
ON THE INSERT 16

SEPARATING THE SUBSTRATE 12
INTO SEPARATE COMPONENTS 14

MOUNTING THE INSERT 12 WITH THE SEPARATE
COMPONENTS 14 THEREON TO THE CARRIER TRAY 18

TRANSPORTING AND HANDLING THE CARRIER
TRAY 18 WITH THE INSERT 12 MOUNTED THERETO
USING STANDARDIZED EQUIPMENT

FOLLOWING TRANSPORTING AND HANDLING,
REMOVING THE INSERT 12 FROM THE CARRIER TRAY 18

REMOVING SEPARATE COMPONENTS 14
FROM INSERT 12

FIGURE 11

SYSTEM AND METHOD FOR DICING SEMICONDUCTOR COMPONENTS

CROSS REFERENCE TO RELATED APPLICATIONS

This application is a continuation of application Ser. No. 09/110,226 filed Jul. 6, 1998, U.S. Pat. No. 6,136,137.

FIELD OF THE INVENTION

This invention relates generally semiconductor manufacture and particularly to a system and method for icing semiconductor components, such as bare dice and chip scale packages.

BACKGROUND OF THE INVENTION

Semiconductor components are typically manufactured using wafer level fabrication processes. Semiconductor dice, for example, are fabricated by subjecting silicon wafers to well known processes. Following the fabrication process, the dice must be separated into individual units. The separation process is sometimes referred to as "dicing". Dicing is typically accomplished by cutting the wafer with a saw blade, an etchant, a liquid jet stream, or a laser beam.

With a conventional dicing process, the wafer can be mounted to a support member known as a "film frame". The film frame includes a frame, and an elastomeric adhesive film stretched across the frame. The adhesive film secures the wafer to the frame, and maintains the dice in a stationary position for dicing.

Semiconductor dice can also be packaged using wafer level processes. For example, one type of package, known as a chip scale package, can be fabricated while the dice are still contained on the wafer. U.S. Pat. Nos. 5,685,885 and 5,682,061 to Khandros et al. disclose representative wafer level fabrication processes for chip scale packages. Following the packaging process, the wafers are diced to separate the chip scale packages into individual units.

With either bare dice or chip scale packages, the separated components can subsequently be transferred to a carrier adapted to hold multiple components. The carriers are used to transport the components for further processing, such as testing, and for assembling the components to circuit boards and electronic devices.

One type of carrier used widely in the industry, is manufactured by Vichem Corporation, of Sunnyvale, Calif. under the trademark "GEL-PAK". These carriers include a plastic frame and an elastomeric membrane formulated to provide a releasable adhesive surface for the separate components. Representative elastomeric membrane materials include silicone, polyurethane, thermoplastic elastomers and polyimide. The elastomeric membrane can accommodate various components having different sizes and shapes.

Typically, the frames for this type of carrier can be stacked for enclosing and protecting the components. In addition, the frames can have a "standard" peripheral configuration, and "standard" features that permit handling by standard equipment, such as magazines and conveyor tracks. The standard features can include lugs, recesses, chamfers and other features formed integrally with the frame. One type of standard carrier is constructed according to JEDEC (Joint Electron Device Engineering Council) standards, and is known as a JEDEC tray.

One aspect of these carriers is that the components are typically placed into the carriers one component at a time. For example with wafer dicing, a pick and place vacuum mechanism can be used to individually remove each die from a film frame for placement in the carrier. Individual loading of components into carriers can be time consuming, and subjects the components to additional handling. It would be advantageous for a dicing system to transfer diced components into carriers in groups, rather than individually.

Further, although an external configuration of a carrier may be standardized, an internal configuration of the carrier is typically adapted for use with only one type of component. For example, some carriers include individual compartments sized for a particular type of component. It would be advantageous for a carrier to have the capability to handle different types and sizes of components.

The present invention is directed to a system for dicing semiconductor components in which multiple diced components can be placed in a carrier of the system at the same time. In addition, an external configuration of a carrier tray of the system is standardized, and an internal configuration can accommodate different types of components.

SUMMARY OF THE INVENTION

In accordance with the present invention, an improved method and system for dicing semiconductor components are provided. For performing the method, a substrate containing multiple semiconductor components is provided. In the illustrative embodiment the components are chip scale packages fabricated on a wafer, such as silicon, or on a panel, such as a glass filled resin. Alternately the method can be performed using bare semiconductor dice contained on a silicon wafer.

The method includes the steps of: providing an insert having an adhesive layer for retaining the substrate; separating the substrate into separate components using the insert; and then mounting the insert with the separated components thereon to a carrier tray with a standard peripheral configuration and features. Separation of the substrate can be accomplished using a conventional dicing technique such as saw cutting, liquid jetting, laser machining, or etching the substrate. Mounting of the insert to the carrier tray can be manual, or can be with vacuum handlers, or other automated equipment.

The system includes the substrate, the insert and the carrier tray. The insert includes a base with the adhesive layer formed thereon. The adhesive layer can comprise an elastomeric material, a pressure sensitive tape, or a vacuum actuated membrane. The carrier tray includes clip members and retention members for retaining one or more inserts thereon. In addition, the carrier tray has a peripheral configuration and external features constructed according to standards of an industry standard setting body, such as JEDEC. Standardized equipment, such as magazines and conveyor tracks, can thus be used for transporting and handling the carrier tray, with the inserts and diced components retained thereon. Still further, the carrier tray includes stacking ridges that permit stacking of multiple carriers.

BRIEF DESCRIPTION OF THE DRAWINGS

FIG. 11 is a block diagram illustrating broad steps in the method of the invention.

DETAILED DESCRIPTION OF THE PREFERRED EMBODIMENTS

As used herein, the term "dicing" refers to separation of a substrate into a plurality of separate components.

Figure 1:
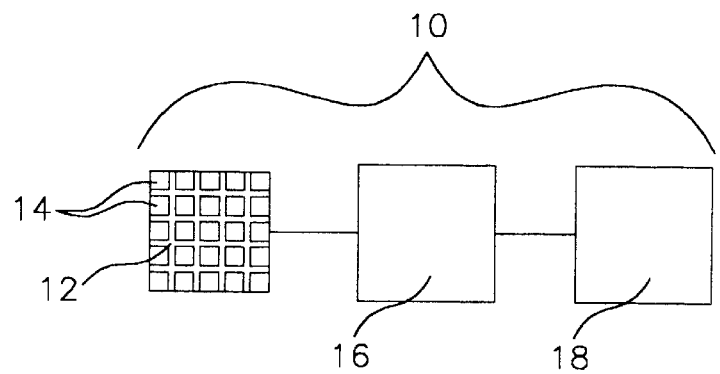
FIG. 1 is a schematic view of a system for dicing semiconductor components constructed in accordance with the invention.

Referring to FIG. 1, a system 10 constructed in accordance with the invention is illustrated. The system 10 includes a substrate 12 containing multiple semiconductor components 14. The system 10 also includes an insert 16 adapted to support the substrate 12 for dicing into separate components 14, and to retain the separated components 14. The system 10 also includes a carrier tray 18 adapted to carry, or transport, multiple inserts 16 with the separated components 14 thereon.

Figure 2:
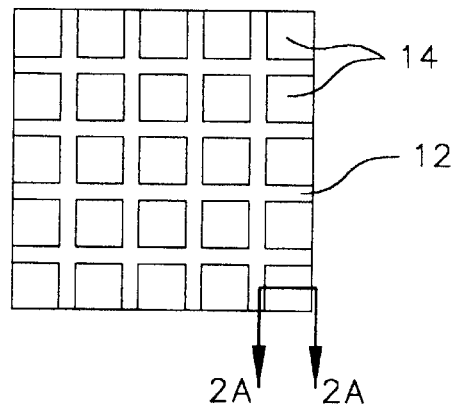
FIG. 2 is an enlarged plan view of a substrate containing multiple semiconductor components prior to dicing in accordance with the invention.
Figure 2A:
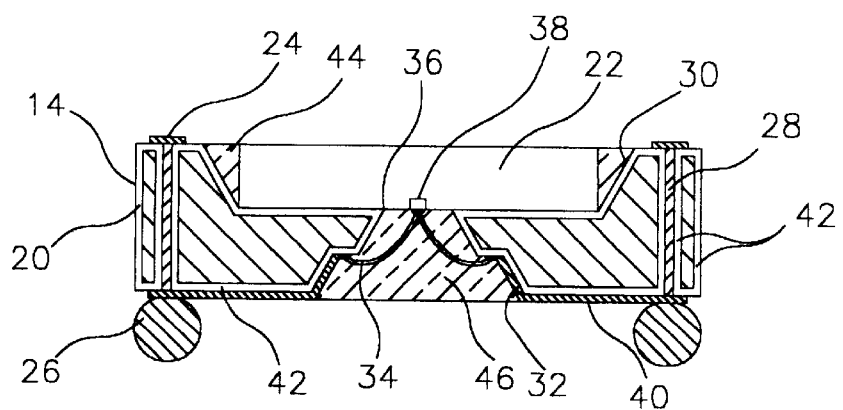
FIG. 2A is an enlarged cross sectional view taken along section line 2A—2A of FIG. 2 illustrating a separated or diced semiconductor component.

Referring to FIGS. 2 and 2A, the substrate 12 and components 14 are illustrated. In the illustrative embodiment, the substrate 12 comprises silicon and the components 14 comprise chip scale packages. The substrate 12 and components 14 can be fabricated as disclosed in U.S. Pat. No. 5,674,785 entitled "Method Of Producing A Single Piece Package For Semiconductor Die", and in U.S. Pat. No. 5,739,585 entitled "Single Piece Package For Semiconductor Die". Both of the these patents are incorporated herein by reference.

Alternately, the substrate 12 can comprise a glass filled resin (e.g., FR-4). Still further, the substrate 12 can comprise a silicon or gallium arsenide wafer, and the components 14 can comprise bare semiconductor dice.

FIG. 2A illustrates the component 14 following separation from the substrate 12. The component 14 includes a silicon package body 20 and a semiconductor die 22. The package body 20 includes a pattern of planar contacts 24 and a matching pattern of ball contacts 26 formed on opposing surfaces thereof. The ball contacts 26 can comprise solder balls arranged in a dense array, such as a ball grid array (BGA), and are adapted for electrical connection to contacts on a mating electrical device, such as a printed circuit board or module substrate. The planar contacts 24 and ball contacts 26 are electrically interconnected by conductive vias 28 in the package body 20. In addition, the ball contacts 26 and planar contacts 24 have a mating configuration which permits multiple components 14 to be stacked to one another.

The component 14 also includes a die mounting cavity 30 wherein the die 22 is mounted face side down, and a wire bonding cavity 32 wherein wires 34 are located. An elongated interconnect opening 36 in the package body 20 connects the die mounting cavity 30 to the wire bonding cavity 32, and provides access for bonding the wires 34 to die contacts 38 on the die 22. The wires 34 are also bonded to conductors 40 formed on the package body 20 in electrical communication with the ball contacts 26.

The component 14 also includes insulating layers 42 that electrically insulate the package body 20. In addition, a die encapsulant 44 fills the die mounting cavity 30 and encapsulates the die 22. A wire encapsulant 46 fills the wire bonding cavity 32 and encapsulates the wires 34.

Figure 3A:
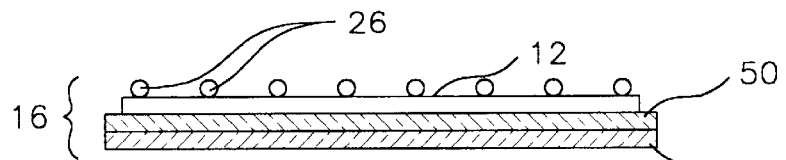
FIG. 3A is a schematic cross sectional view of the substrate attached to an insert of the system prior to dicing.

Referring to FIG. 3A, the insert 16 and the substrate 12 are illustrated prior to separation of the substrate 12 into separate components 14. The insert 16 includes a base 48 and an adhesive layer 50. The base 48 preferably comprises a rigid injection moldable plastic, but can also comprise a metal. Suitable plastics for the base 48 include thermoplastic plastics, thermosetting plastics and liquid crystal polymers. Exemplary plastics include polyetherimide (PEI), polyphenyl sulfide (PPS) and tetrafluoroethylene. The base 48 can also include a carbon filler or a metal layer (not shown) to provide electrical conductivity, and electrostatic discharge (ESD) protection for the components 14.

The adhesive layer 50 can comprise an elastomeric material deposited onto the base 48 to a desired thickness. A representative thickness is from 0.25 mils to 3 mils. The adhesive layer 50 is adapted to adhesively retain the substrate 12 for dicing and then to retain the diced components 14.

Preferably, the adhesive layer 50 is formulated to provide adhesion but also permits the diced components 14 to be easily separated from the adhesive layer 50. Exemplary elastomers for the adhesive layer 50 include silicone gels, polysiloxanes, polyurethanes and acrylics.

The adhesive layer 50 can also comprise a pressure sensitive adhesive (PSA) such as an adhesive tape. The tape can include a polymer film and an adhesive layer formed thereon. One suitable tape is "KAPTON" tape manufactured by DuPont. As will be further explained the adhesive layer 50 can also be constructed as a vacuum actuated membrane.

As shown in FIG. 3A, the substrate 12 can be placed on the adhesive layer 50 with the ball contacts 26 (FIG. 2A) facing away from the adhesive layer 50. Alternately, the substrate 12 can be placed on the adhesive layer 50 with the ball contacts 26 (FIG. 2A) on the components 14 contacting the adhesive layer 50.

Figure 3B:
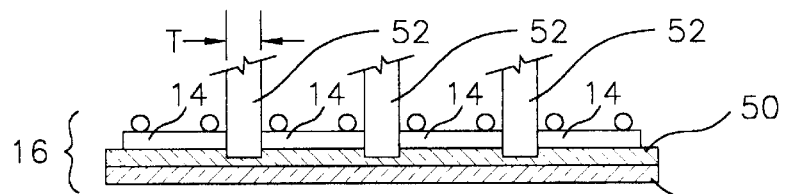
FIG. 3B is a schematic cross sectional view of the substrate and insert during dicing of the components from the substrate.
Figure 3C:
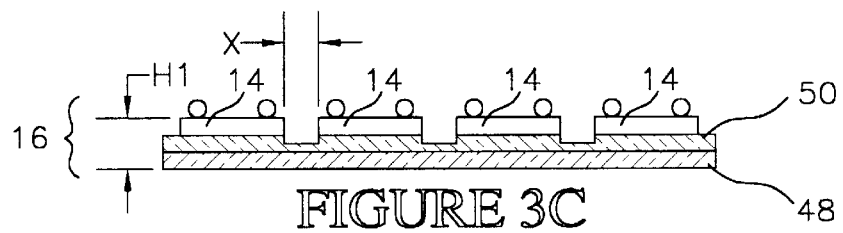
FIG. 3C is a schematic cross sectional view of the substrate and insert following dicing.

Referring to FIG. 3B, separation of the substrate 12 using a conventional semiconductor sawing process is illustrated. Semiconductor sawing is an abrasive process in which exposed diamond particles in saw blades 52 form the cutting edges. In FIG. 3C, the saw blade 52 has cut completely through the substrate 12 and the components 14 are separated. As also shown in FIG. 3C, the blade 52 has cut into the surface of the adhesive layer 50, but not into the base 48 of the insert 16. A thickness "T" of the blades 52 determines the separation distance "X" between the separated components 14. Representative values for the thickness "T" and separation distance "X" are from 1 mil to several hundred mils. Rather than sawing, the substrate 12 can also be separated using another conventional process such as with a liquid jet stream, a laser, or a wet etchant.

Figure 4A:
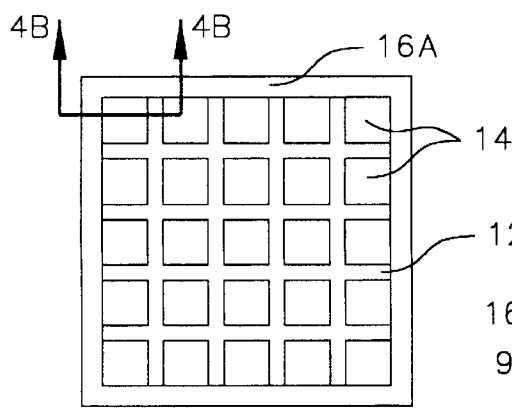
FIG. 4A is a plan view of an alternate embodiment vacuum actuated insert.
Figure 4B:
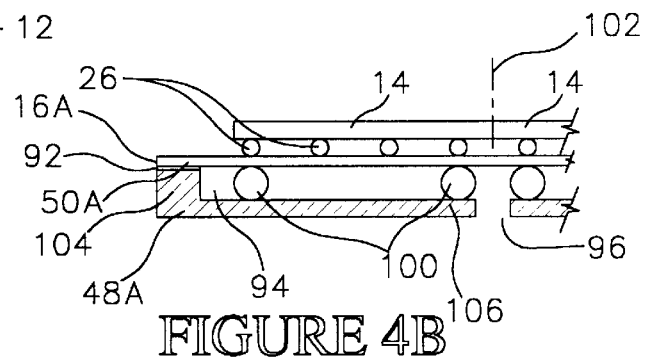
FIG. 4B is an enlarged cross sectional view taken along section line 4B—4B of FIG. 4A.
Figure 4C:
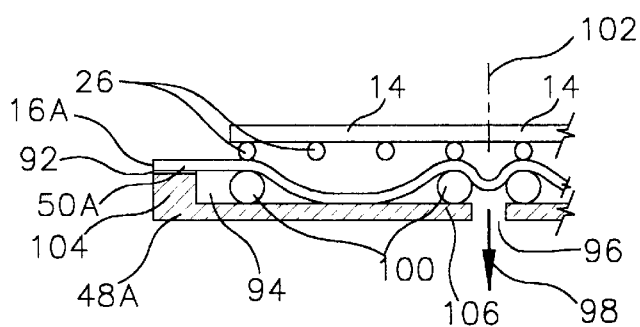
FIG. 4C is an enlarged cross sectional view equivalent to FIG. 4B during application of a vacuum to release separated components from the vacuum actuated insert.

Referring to FIGS. 4A–4C, an alternate embodiment vacuum actuated insert 16A is illustrated. As shown in FIG. 4B, the insert 16A includes a base 48A and an adhesive layer 50A. The base 48A includes sidewalls 104 and a bottom wall 106 configured to form a vacuum chamber 94. The vacuum chamber 94 includes a vacuum opening 96 configured for flow communication with a vacuum source.

Figure 4D:
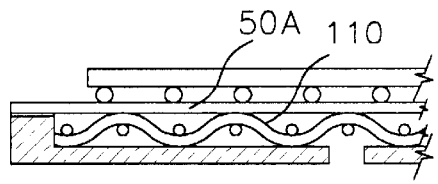
FIG. 4D is an enlarged cross sectional view equivalent to a portion of FIG. 4B showing an alternate embodiment membrane support structure in the form of a woven material.

In the insert 16A, the adhesive layer 50A comprises a membrane that is stretched across the vacuum chamber 94 and attached to the base 48A with an adhesive 92. In addition, cylindrical support rods 100 are placed in the vacuum chamber 94 and support the adhesive layer 50A. The adhesive layer 50A can comprise a polymer film, such as polyimide, having an adhesive surface. Alternately, as shown in FIG. 4D, rather than rods 100 (FIG. 4C), a woven material 110 having a warp and weft structure can be used to support the adhesive layer 50A.

In FIG. 4B, the substrate 12 is placed on the insert: 16A with the ball contacts 26 on the components 14 touching the adhesive layer 50A. Alternately, the substrate 12 can be placed on the insert 16A with the ball contacts 26 facing up. In either case, the adhesive layer 50A supports the components 14 for separation along separation lines 102. Separating the components 14 can comprise sawing with blades 52 (FIG. 3B) as previously described, or can be with a liquid jet stream, a laser, or a wet etchant.

Following separation of the substrate 12 into separate components 14, the insert 16A can be actuated by a vacuum flow 98 to release the components 14 from the adhesive layer 50A. As shown in FIG. 4C, the vacuum flow 98 pulls the adhesive layer 50A onto surfaces of the cylindrical support rods 100 and away from the components 14. In addition, the vacuum flow 98 deforms a surface of the adhesive layer 50A and separates the adhesive layer 50A from the components 14. This allows the components 14 to be easily removed from the adhesive layer 50A using a tool, such as a vacuum handler (not shown). However, release of the components 14 is not performed until the insert 16A has been mounted to the carrier tray 18 and transported as will be further described.

Figure 5:
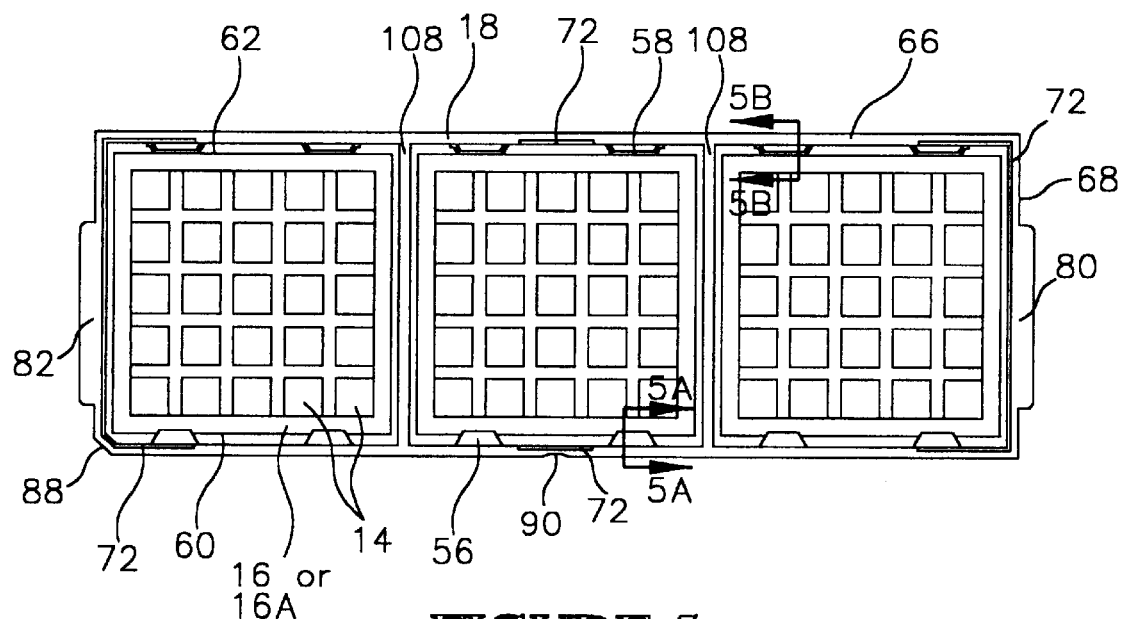
FIG. 5 is a plan view of the insert and separated components placed on a tray of the system.
Figure 5A:
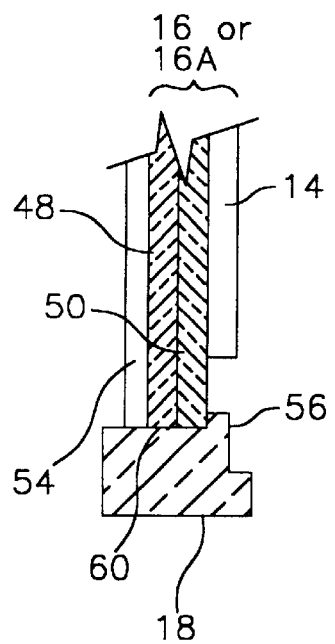
FIG. 5A is a cross sectional view taken along section line 5A—5A of FIG. 5.
Figure 5B:
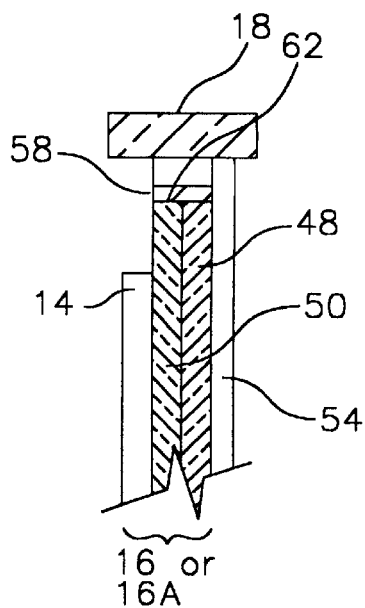
FIG. 5B is a cross sectional view taken along section line 5B—5B of FIG. 5.

Referring to FIG. 5, following separation of the substrate 12 into separate components 14, the inserts 16 (or 16A) with the separated components 14 thereon, are mounted to the carrier tray 18. As shown in FIG. 5A, the carrier tray 18 includes support members 54 for supporting the bases 48 of the inserts 16. In addition, the carrier tray 18 includes retention members 56 that engage edge portions 60 of the bases 48 of the inserts 16. As shown in FIG. 5B, the carrier tray 18 includes clip members 58 that engage edge portions 62 of the bases 48 of the inserts 16. The clip members 58 can include a lip portion (not shown) that overlaps the edge portions 62 of the bases similarly to retention members 56 (FIG. 5A).

In the illustrative embodiment, the carrier tray 18 is constructed to retain three inserts 16. However, depending on the size of the inserts 16 and the carrier tray 18, other arrangements are possible. The inserts 16 can be manually loaded into the carrier tray 18, or can be loaded with a tool such as a vacuum handler. During loading, the inserts 16 can be placed on the support members 54 of the carrier tray 18 such that the clip members 58 are initially compressed. The clip members 58 then provide a biasing force for pressing the edge portions 60 of the inserts 16 against the retention members 56.

With the inserts 16 mounted to the carrier tray 18, standard equipment such as magazines and conveyors, can be used to transport and handle the carrier tray 18. During handling, the adhesive layers 50 on the inserts 16 retain the components 14. In addition, the construction of the clip members 58 and retention members 56, prevents the inserts 16 from separating from the carrier tray 18, even with tipping and up side down movement of the carrier tray 18.

For removing the inserts 16 from the carrier tray 18, the inserts 16 can be slid along the support members 54 to compress the clip members 58, and disengage the retention members 56. The inserts 16 can then be lifted out of the carrier tray 18. Removal of the inserts 16 can be manually, or with a tool, such as a vacuum handler. A tool can also be slipped between the support members 54 to push the inserts 16 out of the carrier tray 18.

Rather than removing the inserts 16 from the carrier tray 18 with the components 14 thereon, the components 14 can be detached one at a time from the adhesive layer 50, while the inserts 16 remain mounted to the carrier tray 18. For example, a vacuum tool can be used to remove the components 14 from the inserts 16.

Figure 6:
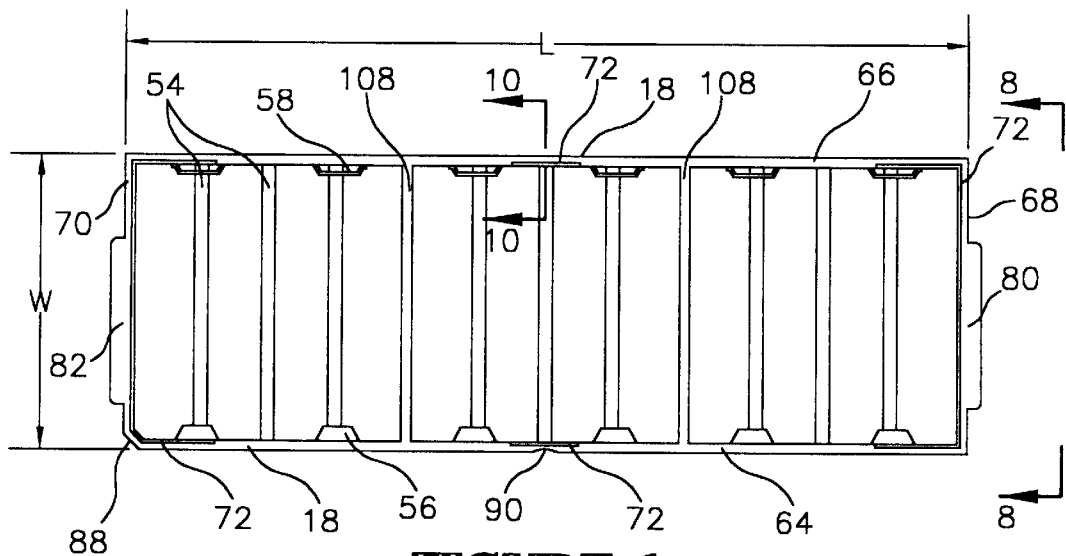
FIG. 6 is a plan view of a carrier tray constructed in accordance with the invention.
Figure 7:
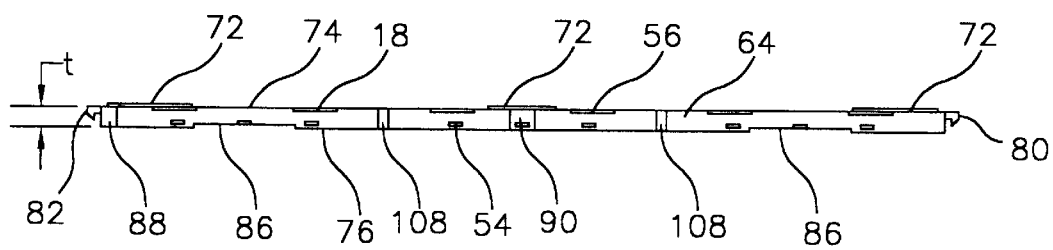
FIG. 7 is a side elevation view of the carrier tray.
Figure 8:
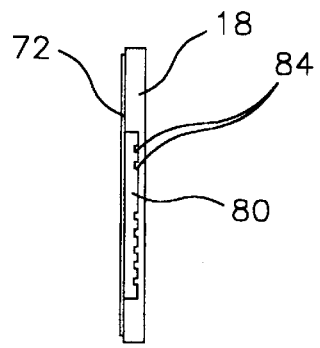
FIG. 8 is an end elevation view of the carrier tray taken along section line 8—8 of FIG. 6.

Referring to FIGS. 6–8, the carrier tray 18 is illustrated separately. The carrier tray 18 is a generally rectangular shaped member having a length L, a width W and a thickness t. The size and peripheral outline of the carrier tray 18 are constructed according to standards of an industry standard setting body, such as JEDEC (Joint Electron Device Engineering Council).

The carrier tray 18 includes parallel spaced side rails 64, 66 and parallel spaced end rails 68, 70. The carrier tray 18 also includes separation ribs 108 that along with the side rails 64, 66 and end rails 68, 70 define separate mounting areas for the inserts 16. These mounting areas have a peripheral outline that is slightly larger than a peripheral outline of the inserts 16. The separation ribs 108 extend between the side rails 64, 66 generally parallel to the end rails 68, 70. Similarly, the support members 54 of the carrier tray 18 extend between the side rails 64, 66 generally parallel to the end rails 68, 70. In addition, the retention members 56 of the carrier tray 18 are formed on side rail 64, and the clip members 58 are formed on side rail 66.

Figure 9:
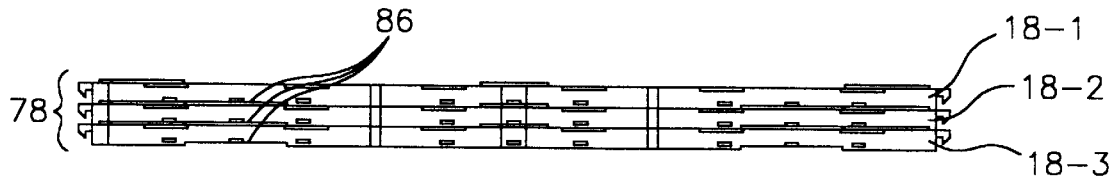
FIG. 9 is a schematic side elevation view of stacked carrier trays.

The carrier tray 18 is designed for stacking with identical carriers on either side. FIG. 9 illustrates a stack 78 of carrier trays 18-1, 18-2, 18-3. Stacking ridges 72 are formed on a first side 74 (FIG. 7) of the carrier tray 18. The stacking ridges 72 are molded integrally with the side rails 64, 66 and with the end rails 68, 70 The stacking ridges 72 have an outer peripheral outline that corresponds in size and shape to an inner peripheral outline of the side rails 64, 66 and end rails 68, 70 on an opposing second side 76 (FIG. 7) of the carrier tray 18.

The inserts 16 (FIG. 3A), or 16A (FIG. 4A), are sized such that when mounted in the carrier tray 18, the separated components 14 (FIG. 2A) do not interfere with stacking. In addition, the separated components 14 are enclosed, and physically protected, by the stacked carrier trays 18-1, 18-2, 18-3. Cut outs 86 (FIG. 7) are formed in the side rails 64, 66 to facilitate separation of the stacked carrier trays 18-1, 18-2, 18-3.

The carrier tray 18 also includes a lug 80 on end rail 68, and a lug 82 on end rail 70. As shown in FIG. 8, the lugs 80, 82 include indentations 84. The lugs 80, 82 and indentations 84 have a standardized configuration that permits handling of the carrier tray 18 by standard equipment.

The carrier tray 18 also includes a chamfered surface 88 formed on end rail 70. The chamfered surface 88 can be used to indicate an orientation of the carrier tray 18. A convex scallop 90 formed in side rail 64 can be used for engaging a pin to mechanically bias orientation of the carrier tray 18.

The clip members 58 are attached to an inner surface of side rail 66. The clip members 58 can comprise resilient metal or plastic spring clips. The clip members 58 can be formed separately and then attached to the side rail 66 with fasteners or adhesives. Alternately, the clip members 58 can be molded integrally with the side rail 66. The retention members 56 can also be molded integrally with an inner surface of side rail 68.

Figure 10:
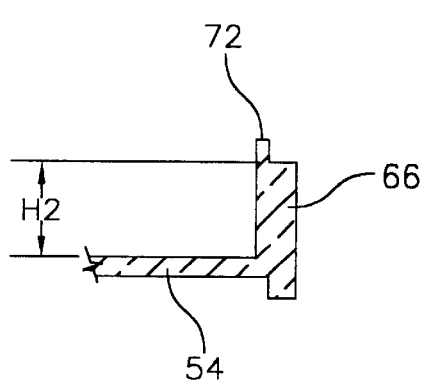
FIG. 10 is a cross sectional view taken along section line 10—10 of FIG. 6.

As shown in FIG. 10, the support members 54 can also be molded integrally with the side rails 68, 70. In addition, a height H2 measured between the surfaces of the support members 54 and upper surface of the siderails 68, 70 is preferably equal to, or less than, a height H1 (FIG. 3C) of the insert 16 and components 14.

Other than the clip members 58, the carrier tray 18 can be formed as a one piece plastic member using an injection molding process. Suitable plastics for the carrier tray 18 include thermoplastic plastics, thermosetting plastics and liquid crystal polymers. Exemplary plastics include polyetherimide (PEI) and polyphenyl sulfide (PPS). The carrier tray 18 can also include a carbon filler, or a metal layer (not shown) to provide electrical conductivity, and electrostatic discharge (ESD) protection for the components 14.

Referring to FIG. 11, broad steps in a method for dicing the substrate 12 in accordance with the invention are illustrated.

1. Providing a substrate 12 having multiple semiconductor components 14.

In the illustrative embodiment the substrate 12 comprises silicon, and the components 14 (FIG. 2A) comprise chip scale packages.

2. Providing an insert 16 (or 16A) configured to retain the substrate 12 for separation into separate components 14.

As shown in FIG. 3A, the insert 16 includes a base 48 with an adhesive layer 50 formed thereon. Alternately, as shown in FIG. 4B, the insert 16A includes an adhesive layer 50A formed as a vacuum displaceable membrane.

3. Providing a carrier tray 18 configured to retain one or more inserts 16 (or 16A).

As shown in FIG. 5, the carrier tray 18 includes retention members 56 and clip members 58. In addition, a peripheral configuration of the carrier tray 18 is standardized, and other features (e.g., lugs 80, 82) are standardized, to permit handling by standardized equipment.

4. Placing the substrate 12 on the insert 16.

FIG. 3A illustrates the placing step.

5. Separating the substrate 12 into separate components 14.

FIG. 3B, illustrates the separating step using saw blades 52. During the separating step the substrate 12 and separated components 14 are retained by the insert 16.

6. Mounting the insert 16 with the separate components 14 thereon to the carrier tray 18.

FIG. 5 illustrates three inserts 12 mounted to the carrier tray 18. The retention members 56 and clip members 58 retain the inserts on the carrier tray 18 even with movement and tipping of the carrier tray 18.

7. Transporting and handling the carrier tray 18 with the insert 12 mounted thereto using standardized equipment.

The transporting step can include stacking multiple carrier trays 18 as shown in FIG. 9.

8. Following transporting and handling, removing the insert 16 from the carrier tray 18.

The insert 16 can be removed from the carrier tray 18 with the separate components 14 retained thereon.

9. Removing separate components 14 from insert 16.

The removing step can be accomplished with a vacuum tool or similar method. FIG. 4C illustrates vacuum actuation of insert 16A for removing the components 14. Alternately, the separate components 14 can be removed as the insert 16 (or 16A) remains attached to the carrier tray 18.

Thus the invention provides an improved method and system for dicing semiconductor components. While the invention has been described with reference to certain preferred embodiments, as will be apparent to those skilled in the art, certain changes and modifications can be made without departing from the scope of the invention as defined by the following claims.

What is claimed is:

1. A system for dicing a substrate comprising a plurality of semiconductor components comprising:
   an insert comprising a base, and an adhesive or a vacuum membrane on the base configured to retain the substrate on the base for separation into the components, and to retain the components on the base following separation; and
   a carrier configured to hold the insert with the components thereon, the carrier comprising at least one retention member configured to retain the insert on the carrier, and a plurality of different features configured to facilitate transport and handling of the carrier.

2. The system of claim 1 wherein the adhesive comprises a double sided tape or an adhesive layer.

3. The system of claim 1 wherein the carrier is configured to retain a plurality of inserts.

4. A system for dicing a substrate comprising a plurality of semiconductor components comprising:
   a base configured to support the substrate;
   an adhesive member on the base configured to retain the substrate on the base for separation into the components and to retain the components on the base following separation; and
   a carrier configured to retain the base with the components thereon, the carrier comprising a plurality of features including an outline, a lug, a chamfer and a stacking ridge, configured to facilitate handling or transporting of the carrier with the base and the components thereon.

5. The system of claim 4 wherein the carrier further comprises a retention member configured to retain the base on the carrier.

6. The system of claim 4 wherein the lug is configured to engage a conveyor.

7. The system of claim 4 wherein the chamfer is configured to indicate an orientation of the carrier.

8. The system of claim 4 wherein the stacking ridge is configured to stack the carrier to a second carrier substantially identical to the carrier.

9. A system for dicing a substrate comprising a plurality of semiconductor components comprising:

a base configured to support the substrate;

a vacuum chamber on the base;

a membrane on the vacuum chamber configured to retain the substrate on the base for separation into the components and to retain the components following separation on the base, the membrane configured to deform upon application of a vacuum to the vacuum chamber for removing the components from the base; and a carrier configured to retain the base with the components thereon, the carrier comprising a plurality of features including an outline, a lug, a chamfer and a stacking ridge configured to facilitate handling and transporting of the carrier with the base and the components thereon.

10. The system of claim 9 further comprising at least one retention member on the carrier configured to retain the base on the carrier.

11. The system of claim 9 wherein the lug is configured to engage a conveyor.

12. The system of claim 9 wherein the chamfer is configured to indicate an orientation of the carrier.

13. The system of claim 9 wherein the stacking ridge is configured to stack the carrier to a second carrier substantially identical to the carrier.

14. The system of claim 9 wherein the carrier comprises a plurality of retention members configured to retain a plurality of bases.

15. A method for dicing a substrate comprising a plurality of semiconductor components comprising:

providing a base comprising an adhesive configured to retain the substrate on the base;

providing a carrier comprising at least one retention member configured to retain the base on the carrier and a plurality of different features configured to facilitate transport or handling of the carrier, the at least one retention member comprising a lip configured to engage an edge of the base and a clip configured to bias the base against the lip;

separating the substrate into the components with the substrate retained on the base during separation, and the components retained on the base following separation; and handling or transporting the carrier with the base retained on the carrier and the components retained on the base.

16. The method of claim 15 wherein the features include an outline, a lug, a chamfer and a stacking ridge.

17. The method of claim 15 wherein the adhesive comprises an adhesive layer or a double sided tape.

18. The method of claim 15 wherein the carrier is configured to retain a plurality of bases substantially identical to the base.

19. The method of claim 15 wherein the separating step is performed with a saw, a liquid jet stream, a laser or an etchant.

20. A method for dicing a substrate comprising a plurality of semiconductor components comprising:

providing a base comprising an adhesive or a vacuum membrane configured to retain the substrate on the base;

separating the substrate into the components with the substrate retained on the base during separation and the components retained on the base following separation;

providing a carrier comprising a lip configured to engage an edge of the base to retain the base on the carrier and a clip configured to bias the base against the lip, the carrier further comprising a plurality of features configured to facilitate handling and transport of the carrier, the features comprising an outline, a lug, a chamfer and a stacking ridge; and handling or transporting the carrier with the base retained on the carrier and the components retained on the base.

21. The method of claim 20 wherein the adhesive comprises an adhesive layer or a double sided tape.

22. The method of claim 20 wherein the carrier is configured to retain a plurality of bases for transport and handling.

23. The method of claim 20 wherein the separating step is performed with a saw, a liquid jet stream, a laser or an etchant.

24. The method of claim 23 wherein the lug is configured to engage a conveyor.

25. The method of claim 23 wherein the chamfer is configured to indicate an orientation of the carrier.

26. The method of claim 23 wherein the stacking ridge is configured for stacking the carrier to a second carrier substantially identical to the carrier.

* * * * *